United States Patent [19]

Smith

[11] 4,392,058
[45] Jul. 5, 1983

[54] ELECTRON BEAM LITHOGRAPHY

[75] Inventor: Kenneth C. A. Smith, Cambridge, England

[73] Assignee: National Research Development Corporation, London, England

[21] Appl. No.: 289,151

[22] Filed: Aug. 3, 1981

Related U.S. Application Data

[63] Continuation of Ser. No. 114,318, Jan. 22, 1980, abandoned.

[30] Foreign Application Priority Data

Feb. 2, 1979 [GB] United Kingdom ............... 7903825

[51] Int. Cl.³ .......................................... H01J 37/00
[52] U.S. Cl. ................................ 250/492.2; 250/398
[58] Field of Search .............. 250/492.1, 492.2, 492.3, 250/398, 396

[56] References Cited

U.S. PATENT DOCUMENTS

| | | | |
|---|---|---|---|
| 4,075,488 | 2/1978 | Okayama et al. | 250/492.2 |
| 4,199,689 | 4/1980 | Takigawa | 250/492.2 |
| 4,213,053 | 7/1980 | Pfeiffer | 250/492.2 |
| 4,243,866 | 1/1981 | Pfeiffer et al. | 250/492.2 |

FOREIGN PATENT DOCUMENTS

| | | |
|---|---|---|
| 1211616 | 11/1970 | United Kingdom . |
| 1308077 | 2/1973 | United Kingdom . |
| 1483171 | 8/1977 | United Kingdom . |
| 2001799 | 2/1979 | United Kingdom . |

Primary Examiner—Bruce C. Anderson
Attorney, Agent, or Firm—Cushman, Darby & Cushman

[57] ABSTRACT

In electron beam lithography apparatus a substrate, on which an exposure pattern is to be produced, is exposed to a plurality of electron beams. In a double beam arrangement one beam is capable of the highest resolution required and has a necessarily low writing speed. The other beam is relatively coarse in beam width but carries a higher current and has a much higher writing speed. Single-pole magnetic lens focusing is used with close angular spacing between the beams. Scanning of the pattern is programmed for economy of time so that the beams produce complementary portions of the pattern, the fine beam defining for example the edges of a structure while the coarse beam scans the area bounded by the edges. Scanning may be simultaneous or sequential. Selection of the relative values of beam potential and the use of energy selective detectors enable the two scanned regions to be imaged.

14 Claims, 4 Drawing Figures

ELECTRON BEAM LITHOGRAPHY

This is a continuation, of application Ser. No. 114,318 filed Jan. 22, 1980 abandoned.

The invention relates to electron beam lithography, particularly in the fabrication of microcircuits.

The term 'lithography' is applied to the tracing on a substrate of the pattern of conductors and device boundaries which forms the basis of a microcircuit. Optical irradiation through a mask has been used to produce the pattern in a coating of resist material which enables the exposed and unexposed areas to be distinguished chemically. The dimensional resolution required in many such patterns now approaches or falls below 1 $\mu$m and optical methods then become inadequate. Electron beam lithography can provide the desired high resolution and is suitable for mask-making or for the direct exposure of device substrates. Analogously with the optical irradiation method an electron resist coating is exposed by the deposition on it of electrical charge at a characteristic surface density. The technique requires an electron probe instrument essentially derived from the scanning electron microscope.

In one mode of operation the area to be exposed is treated by advancing the substrate on a spectrum stage in a succession of steps at each one of which the electron beam is scanned over a small element of the total area. The scanning time required for each element is increased with each improvement in resolution, because the beam current and consequently the rate of charge deposition falls as the beam diameter is reduced. Because of the need to achieve a production rate which is compatible with the other stages of manufacture, any such increase in scanning time is a serious consideration in adopting the electron beam lithographic process.

It is an object of the invention to provide apparatus and a method of operation which enable electron beam lithography to be carried out with resolution in the sub-micron range without a proportionate reduction in the rate of operation.

According to one aspect of the invention apparatus for electron beam lithography comprises means for presenting a substrate for exposure over a predetermined elemental area, electron gun means for producing independently of each other a plurality of electron beams, means for focusing each beam on the surface of the substrate, and means for scanning each beam across the surface to produce in a predetermined elemental area a respective feature of a desired exposure pattern which is complementary to the portion of the pattern produced by the or each other beam.

Preferably at least one of the beams is a 'fine' beam and at least one other beam is a 'coarse' beam. A 'fine beam' in the present context is one suitable for producing an exposure trace of the smallest line width required; a 'coarse beam' is one of lower resolution but higher current than the fine beam.

Preferably the or each fine beam is caused to define a boundary of the desired pattern and the or each coarse beam is caused to scan a respective area within the defined boundary.

The beams may scan the elemental area simultaneously or sequentially, the former being preferred for economy of time.

The exposure of a succession of elemental areas may be carried out so that scanning of one such area by one of the beams is simultaneous with the scanning of a different elemental area by a different beam.

In one form of apparatus two beams may be operated at potentials differing sufficiently from each other that, by means of energy-selective detectors, images of the respective scanning fields may be derived simultaneously from electrons backscattered from the substrate.

The electron gun means may comprise at least a first gun to produce a fine beam and a second gun to produce a coarse beam, each gun having an appropriate beam-limiting aperture. The first gun may have a field-emission cathode and the second gun may have a thermionic cathode. In one form of apparatus each gun may have a field-emission cathode and the apertures may be interchangeable to cause the functions of the guns to be interchanged.

The focusing means associated with each gun having a field emission cathode may comprise a single-pole magnetic lens and the cathode may be positioned close to a vacuum wall of the apparatus to enable the lens to be placed outside the wall.

The focusing means may include a single-pole magnetic lens placed on the side of the substrate remote from the electron gun means.

The electron gun means in one form may comprise pairs of fine beam guns the ones of each pair being arranged to produce beams symmetrically inclined with respect to an axis normal to the substrate surface. In such a configuration a coarse beam gun may be arranged to produce a beam along the axis.

According to another aspect of the invention there is provided a method of electron beam lithography comprising the steps of presenting a substrate for exposure over a predetermined elemental area, focusing each of a plurality of independent electron beams on the surface of the substrate and causing each beam to scan a predetermined elemental area of the surface to produce a respective feature of a desired exposure pattern which is complementary to the portion of the pattern produced by the or each other beam.

The present invention is based on the realisation that in general more than one beam may be employed for scanning and that in particular it is uneconomic to employ a high-resolution beam to write the whole of a pattern which may include broadly different features such as substantial areas as well as fine lines. Such areas must be sharply defined at the edges but can then be filled in with a relatively coarse beam scanned relatively rapidly. The terms 'fine' and 'coarse' are thus applied in this specification to indicate ranges of line-width or beam-width suitable for producing such different features in a variety of applications. The ranges are likely to be separated by an order of magnitude or more. Thus for comparison with a fine beam in the sub-micron range carrying a current of 0.1 $\mu$A the coarse beam might lie in the range of 1 to 10 microns and carry a current of 10 $\mu$A.

In carrying out the invention a problem arises in focusing two or more electron beams which must be relatively inclined in order to irradiate a common area while avoiding an excessive angular separation. It is generally desired to minimise aberrations due to a magnetic lens by working with a short focal length; furthermore the focal quality is improved as the diameter of the lens is increased, but at a short distance from the common focus of two beams it becomes impossible to accomodate two conventional objective lenses side by side. A solution to the problem has been provided by the use for one or both beams of the single-pole lens, referred to in the literature as the 'snorkel' lens. The lens produce a focusing field in front of a nose which extends from a pole-piece and can be made more compactly than the conventional lens in which the field is formed in an axial gap within the pole-piece. Such a lens can be placed behind the cathode but is also particularly suitable as a means of focusing when placed behind the substrate.

An embodiment of the invention will be described with reference to the accompanying drawings in which.

Figure 1:
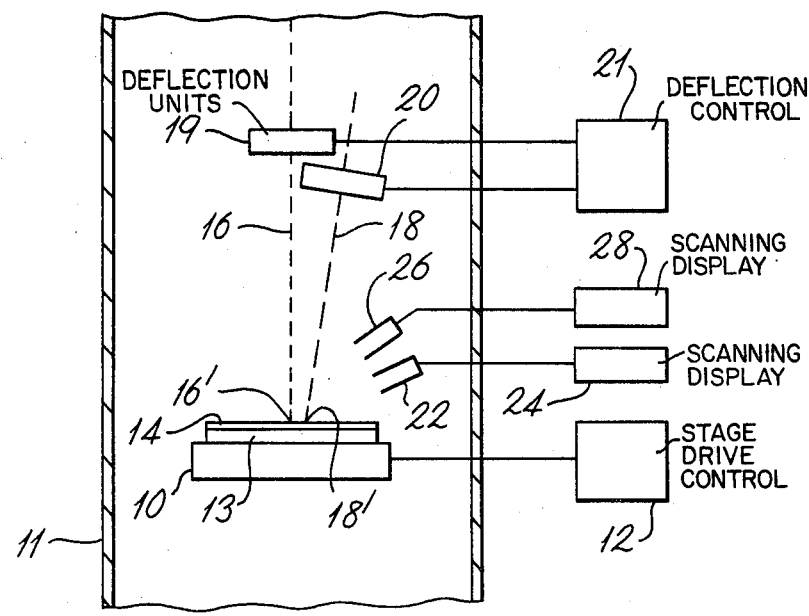
FIG. 1 represents schematically a general arrangement of lithography apparatus for the exposure of a resist-coated substrate in according with the invention.

Referring to FIG. 1, a specimen stage 10 mounted at one end of a high-vacuum column 11 includes drive mechanisms for the X and Y axes with a control unit 12 to enable the stage to be advanced in precisely known small steps on either axis. Such mechanisms are known and will not be illustrated or described. The stage 10 carries a substrate 13 which is to be processed, for example a silicon wafer which may be 50 mm or more in diameter. The substrate 13 is coated with a thin layer 14 of resist material such as polymethal methacrylate. A broken line 16 indicates the optical axis of a low-current electron beam which strikes the layer 14 normally to produce a point 16' of fine focus. A second beam carrying a high current is inclined to the first beam and lies on an axis which is indicated by a broken line 18 and intercepts the layer 14 in a point 18' of coarse focus. Each beam can be deflected in X and Y directions to scan a small area of the layer 14, the stage 10 then being advanced to expose an adjoining area of the resist. Beam 16 is deflected by a unit 19 and beam 18 by a unit 20, the units 19, 20 receiving control signals from a control unit 21 which determines the respective scanning co-ordinates for the two beams. The units 19, 20 represent either magnetic deflection coils or electrostatic deflection plates. Techniques are known by which the edges of adjoining areas may be registered for precise positioning and involve either a video display or an absolute measurement of the movement of stage 10. For the video method one of the beams 16, 18 is reduced in intensity below the threshold level for exposure of the resist and back-scattered electrons are collected at a collector 22. The output from collector 22 is applied to modulate a display 24. The substrate is then scanned to identify registration marks which have been applied previously and the position of stage 10 or the scanning area is adjusted as required. The procedure is then repeated for the other beam. Thus the areas scanned by both areas can be brought into registration with respect to one another and to the substrate by suitable adjustment of the supplies to the deflection units 19, 20. As an added facility during setting up or during exposure scanning, the beams 16, 18 can be set at sufficiently different potentials in the range from 10 to 25 kV that by the use of an additional electron collector 26 and an additional monitor 28 continuous displays of both scanned areas are obtained. Techniques are available by which the collectors are made energy selective.

Figure 2:
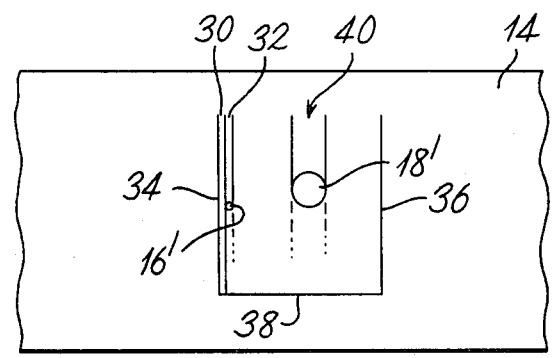
FIG. 2 illustrates the complementary scanning of the substrate of FIG. 1.

The operation of tracing the finest line on the layer 14 clearly only requires a single scan with beam 16, the line being broadened if necessary by subsequent adjacent or overlapping scans. The edge of the line is then defined in dependence on the Gaussian distribution of intensity across the focused spot and also on a voltage-dependent 'spreading characteristic' of the resist material. FIG. 2 shows in an enlarged plan view a part of the layer 14 seen in section in FIG. 1 over which a line scan 30 has been completed by beam 16 and a second scan 32 is in progress. Suppose that exposure of a broad strip from an edge 34 to an edge 36 is required with a third boundary formed by an edge 38; it is only necessary to define the edges 36 and 38 using beam 16 in the way that edge 34 is defined by line scans 30, 32. With considerable economy in time the remaining area is now scanned in a relatively few lines using beam 18 as illustrated by the line 40. The two scanning operations can be carried out in the same area at the same time or in sequence. In a sequential operation the two beams may be directed to scan the allotted areas of different elements of the pattern simultaneously. Thus by scanning each element either simultaneously or in sequence, the two beams are caused in response to the signals from control unit 21 to operate in a complementary manner to produce the desired exposure pattern. Where more than two beams are used the operation of each beam is complementary to the combined result of the other beams in completing the pattern. For any pattern a scanning program can be devised to achieve the most economic result.

Figure 3:
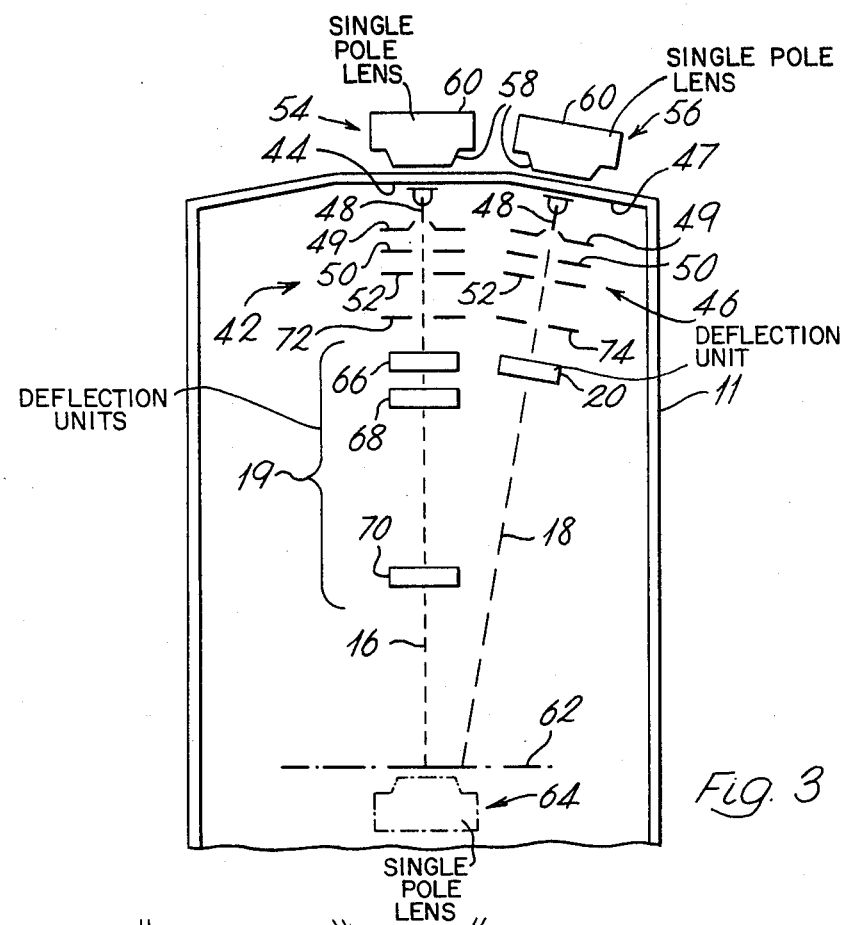
FIG. 3 represents an embodiment of a beam-forming arrangement for use in the apparatus of FIG. 1.

Considering now the production of the beams 16, 18, FIG. 3 shows a portion of the high-vacuum column 11 of FIG. 1 at the end remote from the specimen stage 10. An electron gun 42 is mounted on the optical axis 16 from a wall portion 44 of the vacuum column and a second electron gun 46 is mounted on the optical axis 18 from a wall portion 47 of the column. Each of the guns 42, 46 is of tetrode construction and comprises a field-emission cathode 48, a beam current control electrode 49, a first anode 50 and a second anode 52. The beam potential is determined by the negative potential of cathode 48 with respect to anode 52 which is normally held at earth potential. Anode 52 may also serve as a differential pumping aperture between an ultra high vacuum enclosure for the cathode 48 and the remainder of the column. The ease of control of beam current by means of electrode 49 is an important factor in obtaining uniform exposure of the resist since it is usual to vary the beam current according to to the point reached in the pattern in order to obtain uniform exposure, particularly near to each edge.

Focusing for gun 42 is by means of a magnetic lens 54 and for gun 46 is by means of a similar lens 56, the lenses being arranged externally of the respective walls 44, 47 which are of non-magnetic material. Each cathode 48 is mounted close to the associated wall so that the focusing field extends through the emission region. Each lens 54, 56 is of the single pole type in which a nose piece 58 extends axially from a hollow cylindrical portion 60 which contains an energising coil (not shown). The lens structure can be made very compact while maintaining good focus quality and consequently the beam axes 16, 18 can be relatively inclined at a much smaller angle than would be possible with conventional lenses of small aberration. The beams from guns 42, 46 are brought to focus in a plane indicated by the broken line 62 which in operation contains the resist layer to be exposed. In some configurations of the substrate mounting it may be practicable to employ alone or additionally a lens 64, similar to lenses 54, 56, the nosepiece of which is directed along the axis 16 from below the plane 62. The lens 64 would be used particularly when additional focusing of a single beam 16 was desirable to produce the finest possible focus in the plane 62.

It is convenient to be able to select for beam 16 from gun 42 an angle of deflection which is appropriate to the stage of operation. A compound deflection system (unit 19 of FIG. 1) is used in which X and Y deflection coils 66, 68, 70 are situated at three positions relatively displaced along the beam 16 towards plane 62. A field applied only by coil 66 provides a relatively wide angled scan which can be used for rapid scanning over a large field. If normal incidence is required, deflection in one sense at coil 66 may be followed by a suitably related deflection in the opposite sense at coil 68. The beam is caused to strike the resist surface at normal incidence at all deflections but the scanning field is restricted. Finally when lens 64 is in use deflection at coil 66 may be followed by a suitably related opposing deflection at coil 70. In this way the beam may be caused alternatively to pass through the nodal point of the lens 64 or through the focal point of lens 64. In either case the scanning field is severely restricted; the first case provides undistorted scanning over a larger field but in the second case normal incidence is obtained. A single set of deflection coils 20, on axis 18 is normally sufficient for the wider angle scan of the coarse beam. Because of the relatively small diameter of the single-pole lens it will be appreciated that two or more guns 42 each with an associated lens 54 may be arranged in a group or in line and directed at or near to a common focus in plane 62.

The gun configuration of FIG. 3 provides a further degree of flexibility by the inclusion of beam limiting apertures 72, 74 for guns 42, 46 respectively. Aperture 72 will normally be of small diameter to form a fine beam 16 and aperture 74 of larger diameter to pass the higher current of a coarse beam 18. The apertures can however be arranged to be interchangeable so that the normally incident beam 16 carries high current and the inclined beam 18 carries low current at high resolution. Such an exchange of function is possible because both cathodes 48 are of the field emission type which provides the necessary range of current from a small source.

Figure 4:
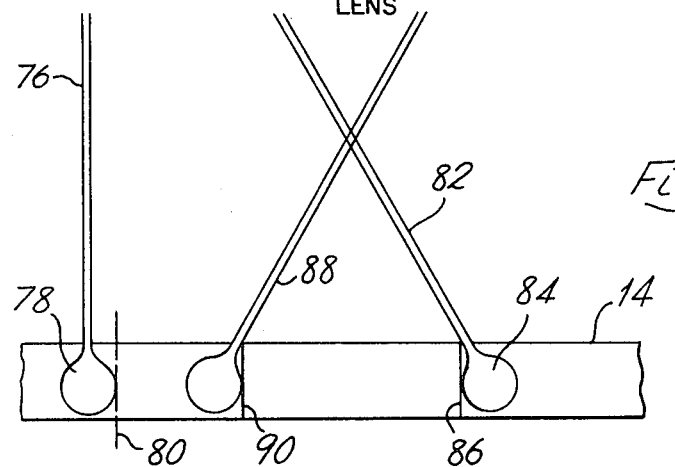
FIG. 4 illustrates the exposure mechanism of a resist layer in dependence on the angle of incidence of the scanning beam.

It is thought that non-normal incidence of the high-resolution beam may be advantageous in the situation illustrated in FIG. 4. In discussing FIG. 2 it was assumed that the width of an exposed track corresponded closely to the diameter of the relevant beam. In practice this correspondence is degraded by two effects: first, a portion of the resist layer outside the beam diameter is exposed by electrons backscattered from the surface of the substrate, and second a bulbous spreading of the exposed volume of the resist occurs around the path of the beam. In FIG. 4 the resist layer 14 is shown in section. A normally incident beam 76 produces an exposure region indicated symbolically by a balloon-shaped volume 78 which may be several times wider than the beam but which will vary in shaped and location with the potential of the beam. A plane 80 just outside the region 78 therefore marks the position closest to beam 76 at which an edge of an exposed element can be defined, and a similar margin must be allowed in calculating the whole scanning pattern of beam 76. This result is generally referred to as the proximity effect. A beam 82 inclined from the left towards the right-hand side of FIG. 4 is also shown as producing a bulbous exposure region 84 of similar volume to the region 78 but assuming approximate symmetry of exposure about the beam an element edge 86 can now be defined which lies very close to the boundary of the beam 82. Such an improvement in definition enables exposure elements to be more closely spaced. It will be noted however that only that edge of an element nearer to the origin of the beam can be so defined. Thus a further beam 88 inclined from the right-hand side of FIG. 4 could produce all right-hand edges such as edge 90 while simultaneously beam 82 was used to produce all left-hand edges. If generally rectangular elements were required the beams 82, 88 could be redirected to produce the corresponding edges above and below the plane of the paper. Alternatively a further pair of guns having axes inclined on a plane perpendicular both to the plane containing the beams 82, 88 and to the layer 14 could be used, in a manner similar to that illustrated, to produce such edges.

It is visualised therefore that in such an application a group of four high-resolution guns would be spaced apart, for example at the corners of a square, each focused by a single pole magnetic lens and the respective beam axes being appropriately inclined. The spacing of such a group would accommodate a centrally placed high-current gun which would then be directed normally to the resist layer. The high-current gun could have a field emission cathode with single-pole magnetic lens or might be of conventional design. The arrangement, number and composition of such a group would be adapted to the particular pattern to be produced and an appropriate program of complementary scanning devised.

In operating a lithography apparatus arranged in the way described with reference to the Figures or otherwise generally in accordance with one aspect of the invention, it is necessary to co-ordinate the stage control 12, and for each gun the scan control 21, the voltage supplied to the beam current control electrode 49, and the other gun and focus controls conventionally required. A simple exposure sequence may be carried out slowly under manual control but, in general, a scanning program and instructions for the sequence of other control steps necessary for device or circuit fabrication will be stored in a computer.

I claim:
1. An apparatus for electron beam lithography comprising:
   means for presenting a substrate for exposure of a desired pattern such that each of a plurality of elemental areas of the substrate is presented in succession for exposure during a respective exposure interval at a single location;
   a plurality of electron guns, the axes of the guns being relatively inclined for substantial convergence at the substrate, the guns being independently operable to produce electron beams, at least a first gun being constructed and arranged to produce a fine electron beam and at least a second gun being constructed and arranged to produce a coarse electron beam;
   means for focusing each beam on the surface of the substrate, deflection means for deflecting the beams across the surface; and
   deflection control means operative to cause said deflection means to produce a portion of the desired exposure pattern which is required to be highly resolved by the continuous deflection of a fine one of said beams across the surface and a different portion of the desired exposure pattern which is required to be less highly resolved by the continuous deflection of a coarse one of said beams across the surface in the elemental area presented during said exposure interval.

2. An apparatus for electron beam lithography comprising:

means for presenting a substrate for exposure of a desired pattern such that each of a plurality of elemental areas of the substrate is presented in succession for exposure at each of a plurality of locations during a respective exposure interval;

a plurality of electron guns, the axes of the guns being relatively inclined for substantial convergence at the substrate, the guns being independently operable to produce electron beams, at least a first gun being constructed and arranged to produce a fine electron beam and at least a second gun being constructed and arranged to produce a coarse electron beam;

means for focusing each beam on the surface of the substrate, and deflection means for deflecting the beams across the surface; and deflection control means operative to cause said deflection means to produce a portion of the desired exposure pattern which is required to be highly resolved by the continuous deflection of a fine one of said beams across the surface in the elemental area presented at one of said locations and a different portion of the desired exposure pattern which is required to be less highly resolved by the continuous deflection of a coarse one of said beams across the surface in the elemental area presented at a different one of said locations during said exposure interval.

3. A method of electron beam lithography comprising the steps of:

presenting in succession a plurality of elemental areas of a substrate for the exposure of a desired pattern during respective exposure intervals;

producing a plurality of electron beams from a respective plurality of electron guns independently of each other, the axes of the electron guns being relatively inclined so that the electron beams are relatively inclined for substantial convergence at the substrate and including at least one fine beam and at least one coarse beam;

focusing each beam on the surface of the substrate; and continuously deflecting the beams across the surface such that a fine one of said beams produces a portion of the desired exposure pattern which is required to be less highly resolved in one of the elemental areas during a single exposure interval.

4. Apparatus according to claim 1 or claim 2 in which the first gun has a field-emission cathode.

5. Apparatus according to claim 4 in which the second gun has a field-emission cathode.

6. Apparatus according to claim 4 in which each gun includes an appropriate beam-limiting aperture, the apertures being interchangeable to enable the positions of the fine beam and the coarse beam to be interchanged.

7. Apparatus according to claim 1 or claim 2 in which the means for focusing at least one of the beams comprises a single-pole magnetic lens having a pole-piece nose which extends along the relevant beam axis towards the cathode.

8. Apparatus according to claim 7 in which such a single-pole lens is arranged externally of the vacuum enclosure adjacent the relevant cathode.

9. Apparatus according to claim 7 in which such a single-pole lens is arranged externally of the vacuum enclosure adjacent the relevant elemental area of the substrate.

10. Apparatus according to claim 1 or claim 2 in which the deflection means for a beam directed normally to the substrate comprises deflection means arranged to enable the angle of deflection to be selected for a desired deflection area and normal incidence at the substrate to be substantially maintained during deflection.

11. Apparatus according to claim 1 or claim 2 including means for detecting electrons scattered from the area of the substrate scanned by one of the beams, the or each other beam being suppressed, to enable that area to be imaged.

12. Apparatus according to claim 11 in which at least one of the other beams is accelerated to a potential different from that of said one of the beams and comprising energy selective electron detection means effective to distinguish electrons scattered from the scanned areas, to enable those areas to be imaged.

13. Apparatus according to claim 1 or claim 2 having a fine beam to define an edge of an exposure pattern in which the beam is inclined to a normal to the substrate surface, the inclination being such that after passing the edge, the projection on the surface of the path of the beam in the substrate lies within the exposure area bounded by the edge.

14. Apparatus according to claim 13 in which each edge of an exposure pattern is thus defined and a coarse beam is provided at normal incidence to the substrate to complete the exposure within the defined edges.

* * * * *